(12) United States Patent
Nagata

(10) Patent No.: US 8,212,970 B2
(45) Date of Patent: Jul. 3, 2012

(54) LIQUID CRYSTAL DISPLAY AND ORGANIC EL DISPLAY

(75) Inventor: Tetsuya Nagata, Mobara (JP)

(73) Assignees: Hitachi Displays, Ltd., Chiba-Ken (JP); Panasonic Liquid Crystal Display Co., Ltd., Hyogo-Ken (JP)

( * ) Notice: Subject to any disclaimer, the term of this patent is extended or adjusted under 35 U.S.C. 154(b) by 443 days.

(21) Appl. No.: 12/285,603

(22) Filed: Oct. 9, 2008

(65) Prior Publication Data
US 2009/0096965 A1  Apr. 16, 2009

(30) Foreign Application Priority Data
Oct. 10, 2007  (JP) .................. 2007-264473

(51) Int. Cl.
*G02F 1/1335* (2006.01)
*G02F 1/1333* (2006.01)
(52) U.S. Cl. .......................... 349/96; 349/158
(58) Field of Classification Search .............. 349/96, 349/158–160
See application file for complete search history.

(56) References Cited

U.S. PATENT DOCUMENTS
2007/0195234 A1 * 8/2007 Hsu et al. ............... 349/113

FOREIGN PATENT DOCUMENTS
JP  8-286174  4/1995
JP  2006-106079  9/2004

OTHER PUBLICATIONS
Birendra Bahadur, Liquid Crystals Applications and Uses, 1990, World Scientific, vol. 1, pp. 173-174.*

* cited by examiner

*Primary Examiner* — Richard Kim
*Assistant Examiner* — David Chung
(74) *Attorney, Agent, or Firm* — Stites & Harbison, PLLC; Juan Carlos A. Marquez, Esq.

(57) ABSTRACT

Disclosed is a liquid display device that is capable of suppressing a change in contrast of a liquid crystal display panel, in which a screen is a curved surface with a curvature in one direction. In a liquid crystal display panel having a cylindrical surface, an upper polarizing plate is attached to a color filter substrate. The upper polarizing plate receives tensile stress in a curved direction. Tensile stress adversely affects polarization characteristics of the upper polarizing plate. According to an embodiment of the invention, if the absorption axis A of the upper polarizing plate is adapted to match with the curved direction of the liquid crystal display panel, it is possible to prevent a change in polarization characteristics of the upper polarizing plate. As a result, it is possible to obtain an image with excellent contrast for a long term.

4 Claims, 13 Drawing Sheets

LIQUID CRYSTAL DISPLAY AND ORGANIC EL DISPLAY

The present application claims priority from Japanese applications JP2007-264473 filed on Oct. 10, 2007, the content of which is hereby incorporated by reference into this application.

BACKGROUND OF THE INVENTION

1. Field of the Invention

The present invention relates to a display device, and in particular, a thin display device, such as a liquid crystal display or an organic EL display, having a curved display screen.

2. Description of the Related Art

In terms of reduction in thickness and weight of a display device, a liquid crystal display is increasingly demanded in a computer display, a terminal for a mobile phone, and a TV. The liquid crystal display has a flat screen.

The reduction in thickness ensures the liquid crystal display to be installed at various places. A place where the liquid crystal device is installed is not limited to a place having a flat surface, but there is a need to install the liquid crystal device at a place having a curved surface. The places having a curved surface include, for example, columns, and walls of streetcars or buses. Meanwhile, there are apparatus in which a display itself needs to be curved. For example, a Japanese pinball game machine (pachinko), a slot machine, and a game machine at a game center may be exemplified. If the liquid crystal device is used in such a game machine, the liquid crystal display needs to be curved. In regards to mobile phones that are increasingly demanded, for improvement in visibility, a display unit having a curved surface is demanded.

However, it is very difficult to manufacture a liquid crystal display panel by using a curved glass substrate. Accordingly, a flat liquid crystal display panel is manufactured by using a flat glass substrate, and thereafter, the liquid crystal display panel is curved. It is necessary to contrive a way to uniformly curve the flat liquid crystal display panel.

JP-A-8-286174 discloses a technology that forms a liquid crystal display panel having a curved surface using a phenomenon that a polarizing plate is curved toward an absorption axis according to temperature and humidity. That is, if the polarizing plate is attached to a liquid crystal cell formed by a TFT substrate and a color filter substrate, and is then left in a temperature-controlled bath at specific temperature and humidity for a predetermined time, thereby a liquid crystal display panel having a specific curved surface is formed.

JP-A-2006-106079 discloses a technology that, when a flat liquid crystal display panel is curved, attaches a uniaxially extended film onto a concave surface side, and leaves the liquid crystal display panel under an atmosphere at 40° C. to 200° C. for 10 minutes to 24 hours, thereby curving the liquid crystal display panel. That is, the liquid crystal display panel is curved by using a phenomenon that the uniaxially extended film is contracted in the extension direction.

The liquid crystal display panel is formed by adhering polarizing plates on the front and rear surfaces of the liquid crystal cell. The liquid crystal cell has a TFT substrate, on which thin film transistors (TFTs) and pixel electrodes are formed, and a color filter substrate, on which color filters are formed, with liquid crystal interposed therebetween. A liquid crystal display panel with a curved surface is formed by curving the liquid crystal cell and the polarizing plates at a time.

In general, the polarizing plate is formed by extending a PVA film in one direction and dip-coating iodine. At this time, the iodine particles are arranged in the extension direction, and the extension direction becomes an absorption axis. For this reason, in the liquid crystal display panel, if tension continues to be applied in a direction perpendicular to the extension direction, that is, the absorption axis, polarization characteristics may be deteriorated. Meanwhile, a retardation film is used in the liquid crystal display panel, but similarly to the polarizing plate, the retardation film is uniaxially extended. For this reason, similarly to the polarizing plate, if tension continues to be applied in the direction perpendicular to the extension axis, that is, the absorption axis, optical characteristics may be deteriorated. In case of a curved liquid crystal display panel, since normal stress is applied to an optical film at its surface, the characteristics of the optical film may be deteriorated, and display characteristics, such as contrast, may be deteriorated.

According to the technology disclosed in JP-A-8-286174 JP-A-2006-106079, the liquid crystal display panel is curved by using a phenomenon that a uniaxially extended film is likely to be curved in a specific direction. However, these documents have not suggested and described the above-described problem, that is, if tension continues to be applied in the direction perpendicular to the extension direction of the polarizing plate or the like, that is, the absorption axis, optical characteristics may be deteriorated.

SUMMARY OF THE INVENTION

There is a need for a thin display device, such as a liquid crystal display or organic EL display having a curve surface, which is capable of preventing the optical characteristics of an optical film, such as a polarizing plate or a retardation film, from being deteriorated. There is also a need for an organic EL display that, when a circular polarizing plate is used on the surface of the organic EL display so as to improve contrast, is capable of preventing the optical characteristics of the circular polarizing plate from being deteriorated.

To this end, in a liquid crystal display having a curved screen with a curvature in one direction, a change in optical characteristics of a polarizing plate is suppressed by making an absorption axis of an upper polarizing plate have a special relation with the curvature of the screen. That is, when the polarizing plate is curved so as to receive tension, the curved direction of the screen is adapted to match with the absorption axis of the polarizing plate, that is, the extension axis. When the polarizing plate is curved so as to receive compression stress, the absorption axis of the polarizing plate is adapted to match with a direction perpendicular to the curved direction of the screen at right angle. In case of an organic EL display, an extension axis of a retardation film or a polarizing plate forming a circular polarizing plate is changed in the same manner as the liquid crystal display depending on whether the circular polarizing plate receives tensile stress or compression stress. The specific configuration is as follows.

(1) According to a first aspect of the invention, a liquid crystal display includes a liquid crystal display panel, the liquid crystal display panel including a TFT substrate having formed thereon pixel electrodes and TFTs, a color filter substrate having formed thereon color filters, liquid crystal interposed between the color filter substrate and the TFT substrate, a first polarizing plate attached to the color filter substrate, and a second polarizing plate attached to the TFT substrate. The liquid crystal display panel has an outwardly convex screen with a curvature in one direction, and the first polarizing plate has an absorption axis in a direction in which the liquid crystal display panel has a curvature.

(2) According to a second aspect of the invention, in the liquid crystal display according to the first aspect of the invention, the second polarizing plate may have an absorption axis in a direction perpendicular to that in which the liquid crystal display panel has a curvature.

(3) According to a third aspect of the invention, a liquid crystal display includes a liquid crystal display panel, the liquid crystal display panel including a TFT substrate having formed thereon pixel electrode and TFTs, a color filter substrate having formed thereon color filters, liquid crystal interposed between the color filter substrate and the TFT substrate, a first polarizing plate attached to the color filter substrate, and a second polarizing plate attached to the TFT substrate. The liquid crystal display panel has an outwardly convex screen with a curvature in one direction, and the first polarizing plate substantially has an absorption axis in a direction in which the liquid crystal display panel has a curvature. An angle between an axis in the direction, in which the liquid crystal display panel has a curvature, and the absorption axis of the first polarizing plate is 10±5 degrees.

(4) According to a fourth aspect of the invention, in the liquid crystal display according to the third aspect of the invention, the absorption axis of the second polarizing plate and a direction perpendicular to that in which the liquid crystal display panel has a curvature may be 10±5 degrees.

(5) According to a fifth aspect of the invention, a liquid crystal display includes a liquid crystal display panel, the liquid crystal display panel including a TFT substrate having formed thereon pixel electrodes and TFTs, a color filter substrate having formed thereon color filters, liquid crystal interposed between the color filter substrate and the TFT substrate, a first polarizing plate attached to the color filter substrate, and a second polarizing plate attached to the TFT substrate. The liquid crystal display panel has an outwardly concave screen with a curvature in one direction, and the first polarizing plate has an absorption axis in a direction perpendicular to a direction in which the liquid crystal display panel has a curvature.

(6) According to a sixth aspect of the invention, in the liquid crystal display according to the fifth aspect of the invention, the second polarizing plate may have an absorption axis in the direction in which the liquid crystal display panel has a curvature.

(7) According to a seventh aspect of the invention, a liquid crystal display includes a liquid crystal display panel, the liquid crystal display panel including a TFT substrate having formed thereon pixel electrodes and TFTs, a color filter substrate having formed thereon color filters, liquid crystal interposed between the color filter substrate and the TFT substrate, a first polarizing plate attached to the color filter substrate, and a second polarizing plate attached to the TFT substrate. The liquid crystal display panel has an outwardly concave screen with a curvature in one direction, and an angle between the absorption axis of the first polarizing plate and a direction perpendicular to that in which the liquid crystal display panel has a curvature is 10±5 degrees.

(8) According to an eighth aspect of the invention, in the liquid crystal display according to the seventh aspect of the invention, an angle between the absorption axis of the second polarizing plate and the direction in which the liquid crystal display panel has a curvature may be 10±5 degrees.

(9) According to a ninth aspect of the invention, an organic EL display includes an organic EL display panel, the organic EL display panel including an OLED substrate having formed thereon an organic EL layer, and a seal substrate arranged to be opposed to the OLED substrate. A screen of the organic EL display panel is formed on the seal substrate, and the organic EL display panel is curved to have an outwardly convex shape with a curvature in one direction. A circular polarizing plate having a retardation film and a polarizing plate is provided on the seal substrate, and an extension axis of the retardation film or the polarizing plate is adapted to match with a direction in which the organic EL display panel has a curvature.

(10) According to a tenth aspect of the invention, an organic EL display includes an organic EL display panel, the organic EL display panel including an OLED substrate having formed thereon an organic EL layer, and a seal substrate arranged to be opposed to the OLED substrate. A screen of the organic EL display panel is formed on the seal substrate, and the organic EL display panel is curved have an outwardly concave shape with a curvature in one direction. A circular polarizing plate having a retardation film and a polarizing plate is provided on the seal substrate, and an extension axis of the retardation film or the polarizing plate is adapted to be perpendicular to a direction in which the organic EL display panel has a curvature.

(11) According to an eleventh aspect of the invention, an organic EL display includes an organic EL display panel, the organic EL display panel including an OLED substrate having formed thereon an organic EL layer, and a seal substrate arranged to be opposed to the OLED substrate. A screen of the organic EL display panel is formed on the OLED substrate, and the organic EL display panel is curved to have an outwardly convex shape with a curvature in one direction. A circular polarizing plate having a retardation film and a polarizing plate is provided on the OLED substrate, and an extension axis of the retardation film or the polarizing plate is adapted to match with a direction in which the organic EL display panel has a curvature.

(12) According to a twelfth aspect of the invention, an organic EL display includes an organic EL display panel, the organic EL display panel including an OLED substrate having formed thereon an organic EL layer, and a seal substrate arranged to be opposed to the OLED substrate. A screen of the organic EL display panel is formed on the OLED substrate, and the organic EL display panel is curved have an outwardly concave shape with a curvature in one direction. A circular polarizing plate having a retardation film and a polarizing plate is provided on the OLED substrate, and an extension axis of the retardation film or the polarizing plate is adapted to be perpendicular to a direction in which the organic EL display panel has a curvature.

According to the aspects of the invention, in a liquid crystal display in which a screen is curved to have an outwardly convex shape with a curvature in one direction, the absorption axis of an upper polarizing plate, which is attached to the color filter substrate, that is, the extension axis is adapted to match with the curved direction of the screen. Therefore, it is possible to suppress a change in polarization characteristics of the polarizing plate. Furthermore, the absorption axis of a lower polarizing plate, which is attached to a lower side of the TFT substrate, that is, the extension axis is adapted to match with the curved direction of the screen. Therefore, it is possible to suppress a change in polarization characteristics of the lower polarizing plate.

In a liquid crystal display in which a screen is curved to have an outwardly concave shape with a curvature in one direction, the absorption axis of a polarizing plate, that is, the extension axis is adapted to vary depending on whether the polarizing plate receives tensile stress or compression stress. Therefore, it is possible to suppress a change in polarization characteristics of the polarizing plate. As a result, it is possible to obtain a reliable liquid crystal display that has no change in image quality, such as contrast, for a long term.

In an organic EL display, when a circular polarizing plate is used in order to increase contrast, the extension axis of a retardation film or a polarizing plate forming the circular polarizing plate is adapted to vary depending on whether the circular polarizing plate receives tensile stress or compression stress. As a result, it is possible to obtain an organic EL display that has no change in contrast of an image for a long term.

DETAILED DESCRIPTION OF THE INVENTION

Figure 1:
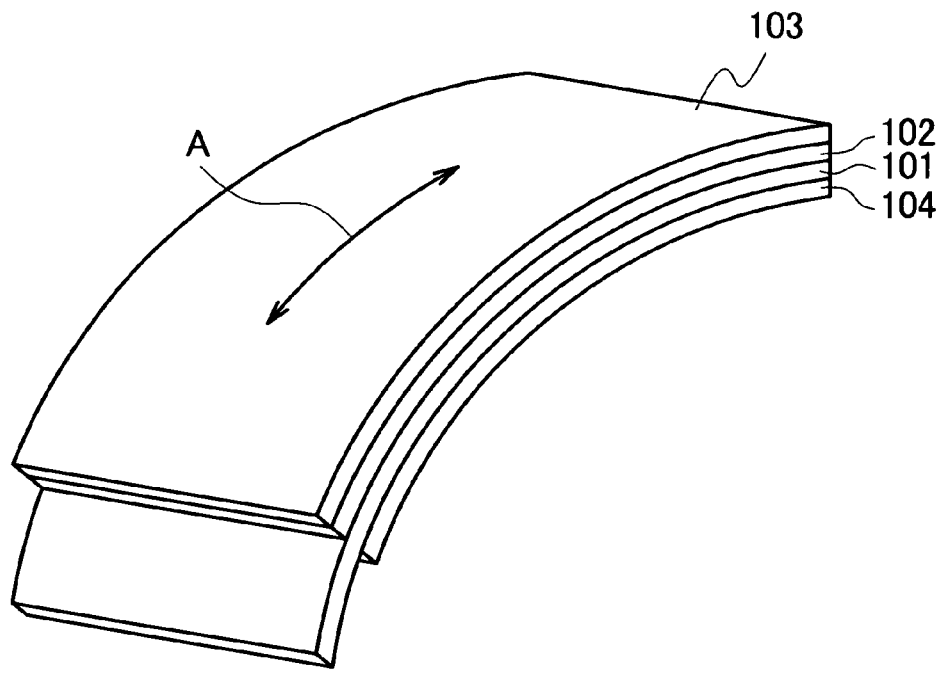
FIG. 1 is a perspective view of a liquid crystal display panel according to an embodiment of the invention as viewed from the front side.

FIG. 1 is an exterior perspective view of a liquid crystal display according to an embodiment the invention as viewed from the front side. In FIG. 1, the liquid crystal display has a TFT substrate 101 having formed thereon TFTs and pixel electrodes, and a color filter substrate 102 with liquid crystal interposed therebetween. The TFT substrate 101 is formed to be larger than the color filter substrate 102 since a space is needed in which a driver chip for driving is attached or a flexible wiring board for supplying image signals and power from the outside. An upper polarizing plate 103 is attached to the color filter substrate 102, and a lower polarizing plate 104 is attached to the lower side of the TFT substrate 101.

A liquid crystal display panel 10 of FIG. 1 is curved to have a curvature in one direction. Though not shown in FIG. 1, the liquid crystal display panel 10 follows a frame 11 with a curvature or a surface cover with a curvature, thereby having a curvature. That is, as described below, the TFT substrate 101 or the color filter substrate 102 is polished thin so as to be easily curved.

Figure 2:
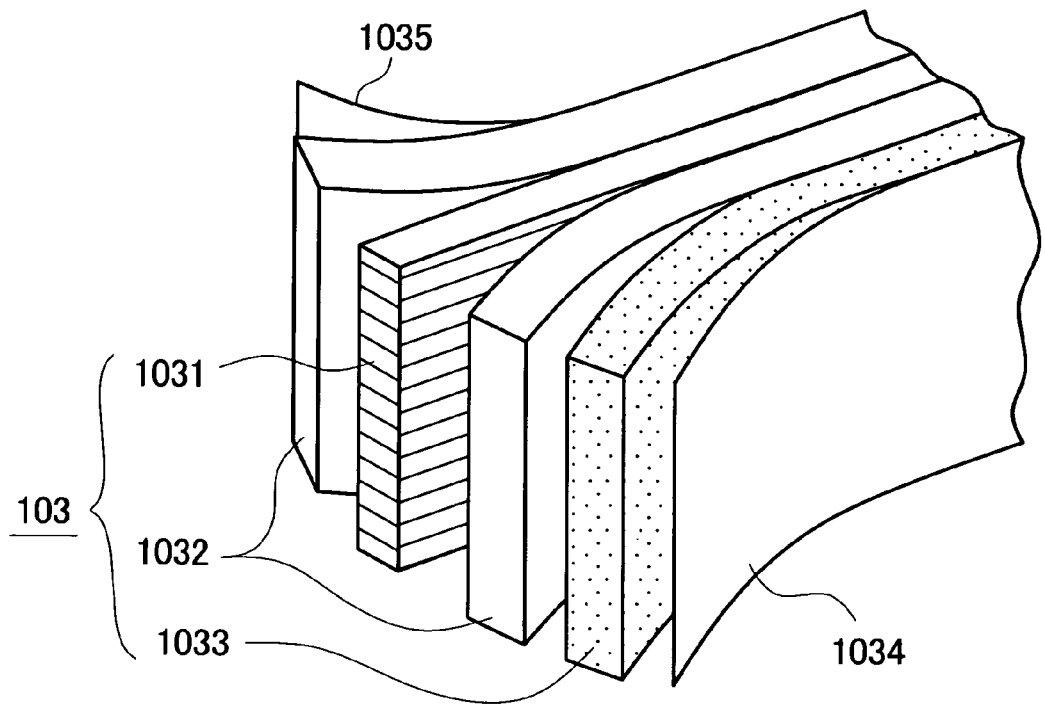
FIG. 2 is a configuration diagram of a polarizing plate.

The upper polarizing plate 103 of FIG. 1 is curved along the color filter substrate 102. A direction indicated by an arrow A of the upper polarizing plate 103 of FIG. 1 is an extension axis direction. In FIG. 1, the extension axis direction of the upper polarizing plate 103, that is, an absorption axis direction becomes a curved direction. FIG. 2 shows the structure of a polarizing plate. The polarizing plate has a polarizer 1031 that is sandwiched with triacetyl cellulose, called TAC, and transmits only a light component, which vibrates in a predetermined direction. In general, the polarizer 1031 is formed by uniaxially extending a PVA film and dip-coating iodine. At this time, the iodine particles are arranged in the extension direction, and thus the extension direction becomes the absorption axis.

Figure 3:
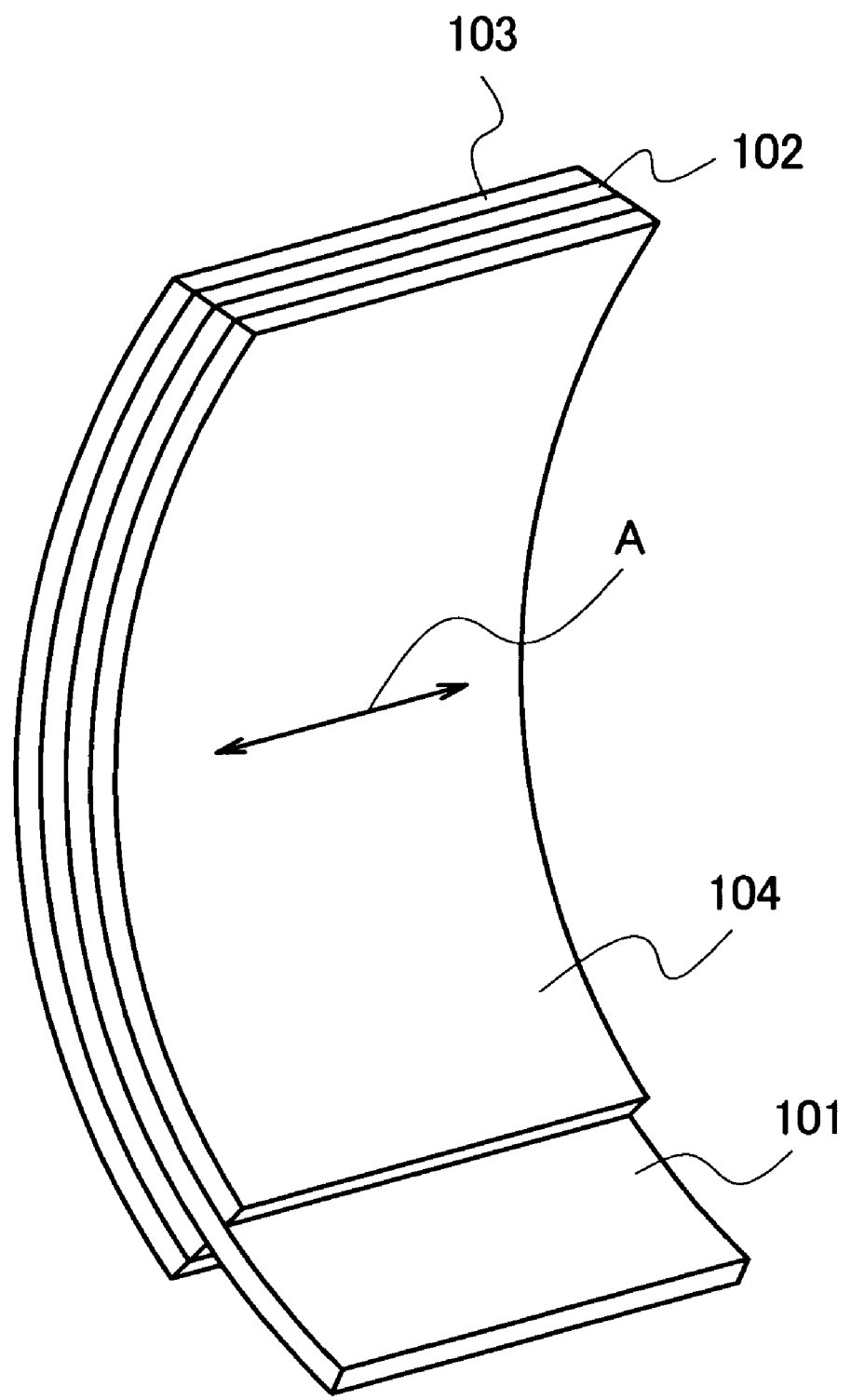
FIG. 3 is a perspective view of a liquid crystal display panel according to an embodiment of the invention as viewed from the rear side.

The polarizer 1031 has insufficient mechanical strength, and thus it is sandwiched with a TAC film 1032 (triacetyl cellulose film) so as to ensure the strength of the polarizing plate. Since the polarizing plate is attached to the color filter substrate 102, and an adhesive is provided on one side of the TAC film 1032. The polarizing plate is attached to the color filter substrate by the adhesive. In FIG. 3, until the polarizing plate is attached to the color filter substrate 102, an adhesive layer 1033 is protected by a release film 1034. The other side of the TAC film 1032 on which no adhesive is provided is protected by a protection film 1035 until the polarizing plate is adhered to the liquid crystal display panel 10.

The polarizing plate has the above-described structure, and accordingly, if tension is continuously applied in a direction perpendicular to the absorption axis direction of the polarizing plate, that is, the extension axis direction, the iodine particles may be deranged. For this reason, contrast may be deteriorated. In contrast, according to the embodiment of the invention, if tension is applied in the extension axis direction, the absorption axis direction, of the polarizing plate, that is, the polarizer 1031, optical characteristics of the polarizing plate is prevented from being deteriorated.

FIG. 3 is a diagram of the liquid crystal display panel 10 of FIG. 1 as viewed from the rear side. The liquid crystal display panel 10 has the same configuration as that shown in FIG. 1. In FIG. 3, a lower polarizing plate 104 is attached to the TFT substrate 101. The lower polarizing plate 104 has the same configuration as that shown in FIG. 2. In FIG. 3, the lower polarizing plate 104 is tightly adhered to the TFT substrate 101, and thus in a state the liquid crystal display panel 10 is curved, compression stress is applied to the lower polarizing plate 104. Accordingly, it is not necessary to match the extension axis direction of the lower polarizing plate 104 shown in the FIG. 3 with the curved direction. It is preferable to make the extension axis direction as away from the curved direction of the liquid crystal display panel 10 as possible. Therefore, the extension axis direction of the polarizing plate 104 indicated by an arrow A in FIG. 3, that is, the absorption axis direction is perpendicular to the curved direction of the liquid crystal display panel 10.

The absorption axis directions of the upper polarizing plate 103 and the lower polarizing plate 104 are arranged at right angle or in parallel depending on the display mode, that is, a normally black mode or a normally white mode, or depending on the driving method of liquid crystal, that is, TN, IPS (In Plane Switching), or VA (Vertical Alignment). In the liquid crystal display panel 10 having a curved surface, tension has a larger effect on the characteristics of the upper polarizing plate 103. Therefore, in some driving methods, if necessary, it is possible to achieve an effect only by matching the absorption axis of the upper polarizing plate 103 with the curved direction of the liquid crystal display panel 10.

Although the polarizing plate is attached to the color filter substrate 102 or the TFT substrate 101 by the adhesive layer 1033, the absorption axis of the polarizing plate may not perfectly match with the axis in the curved direction of the liquid crystal display panel 10 or the axis perpendicular to the curved direction (referred to as the axis of the liquid crystal display panel 10) due to manufacturing errors. In this case, it is also possible to achieve an effect if the absorption axis of the polarizing plate is adapted to match with the axis of the liquid crystal display panel 10 within 5 degrees.

Meanwhile, the axis of the screen of the liquid crystal display panel 10 may be willingly misaligned from the axis of the polarizing plate. For example, when a person views the liquid crystal display panel 10 with the sunglasses having polarization characteristics, if the absorption axis of the sunglasses and the absorption axis of the upper polarizing plate 103 of the liquid crystal display panel 10 are arranged at right angle, the screen becomes unnatural. In many cases, the person views the screen of the liquid crystal display panel 10 in a horizontal direction. For this reason, it is preferable that the absorption axis of the upper polarizing plate 103 be misaligned from the axis of the liquid crystal display panel 10.

Figure 4:
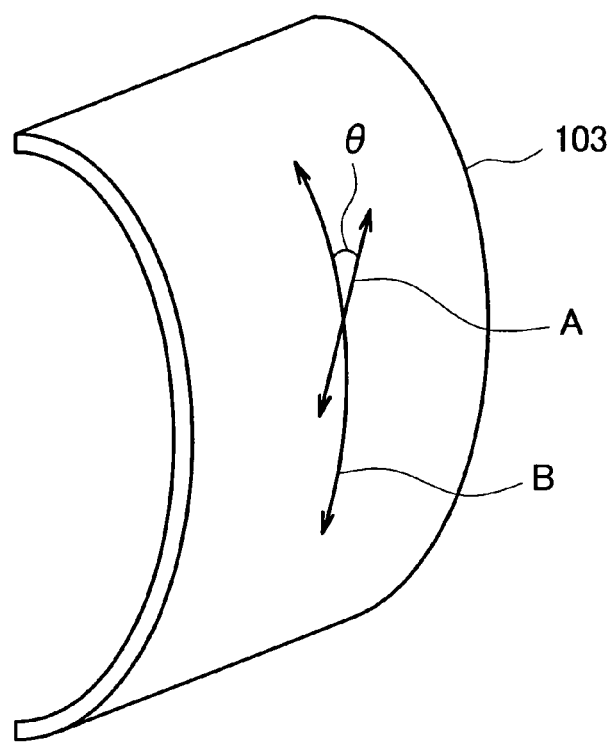
FIG. 4 is a perspective view of an upper polarizing plate according to an embodiment of the invention.
Figure 5:
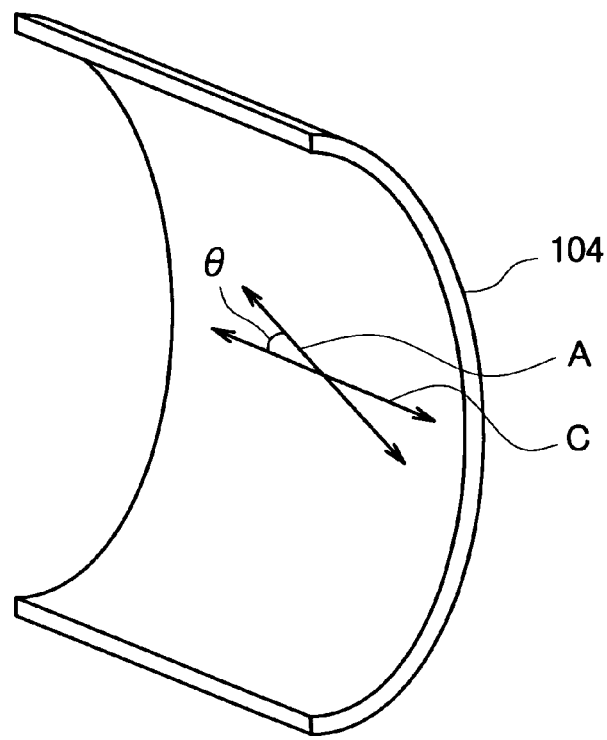
FIG. 5 is a perspective view of a lower polarizing plate according to an embodiment of the invention.

FIG. 4 shows an example of such a case. In FIG. 4, an angle $\theta$ between the absorption axis of the upper polarizing plate 103 and the curved direction of the upper polarizing plate 103 is 10 degrees. In this case, it is also possible to achieve an effect even though the value $\theta$ is set to 10±5 degrees in consideration of a manufacturing variation. FIG. 5 shows the relationship between the curved direction of the lower polarizing plate 104 and the absorption axis of the lower polarizing plate 104. In FIG. 5, an angle $\theta$ between a direction C perpendicular to the curved direction of the lower polarizing plate 104 and the absorption axis A of the lower polarizing plate 104 is 10 degrees. In this case, it is also possible to achieve an effect even though the value $\theta$ is set to 10±5 degrees.

A case where the invention is applied to a specific display device will be described in connection with the following examples.

First Example

Figure 6:
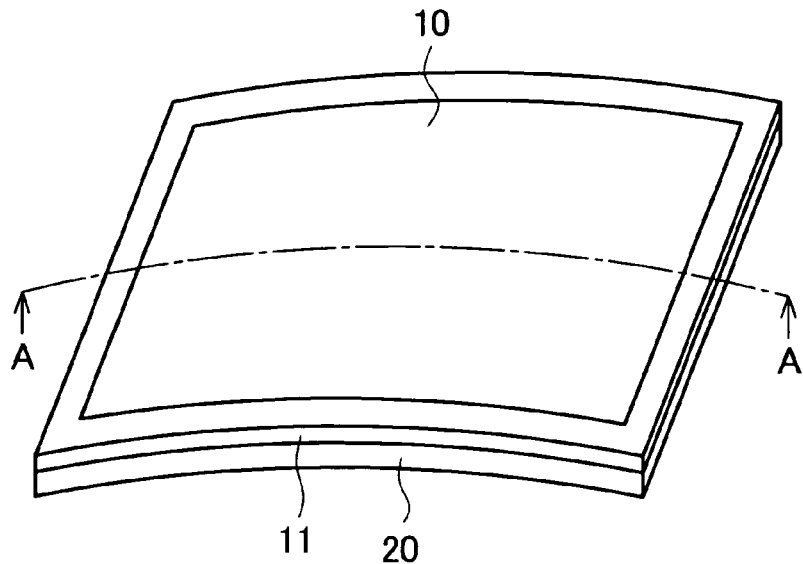
FIG. 6 is a perspective view of a liquid crystal display according to a first example.

FIG. 6 is an exterior view of a display device according to a first example. FIG. 6 shows a display device in which a screen has an outwardly convex shape. Such a display device is used as a display device to be installed on a column at a station or a display device for amusement, for example, a slot machine. In FIG. 6, the liquid crystal display panel 10 is outwardly curved. The outwardly curved liquid crystal display panel 10 has the same configuration as that shown in FIG. 1 or 3. That is, the glass substrate is reduced in thickness such that the liquid crystal display panel 10 can be easily curved, and it is accommodated in the curved frame 11, thereby forming the liquid crystal display panel 10 having a curved screen. Though not shown in FIG. 6, the liquid crystal display panel 10 is covered with a transparent surface cover 8. That is, the surface cover 8 is provided between the frame 11 and the liquid crystal display panel 10.

In FIG. 6, the liquid crystal display panel 10 is covered with the curved frame 11, excluding a display unit. A backlight 20 is provided on the rear surface of the liquid crystal display panel 10. As described below, the backlight 20 has various optical parts and a light source.

Insofar as the liquid crystal display panel 10 having a curved surface can be formed by using a glass substrate, a known technology for manufacturing a liquid crystal display may be used, and it is advantageous in terms of costs and reliability. How much glass can be curved is determined in view of a glass thickness.

Figure 7A:
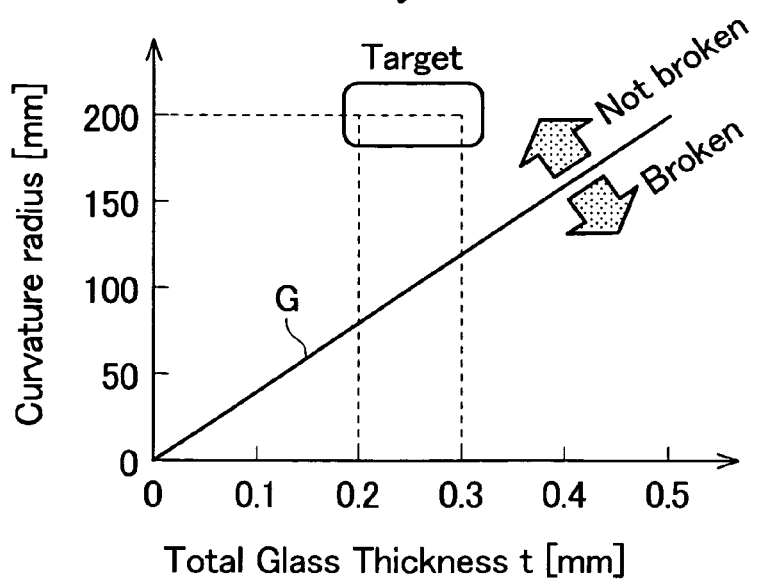
FIG. 7A is a graph showing the relationship between a glass thickness and a curvature.
Figure 7B:
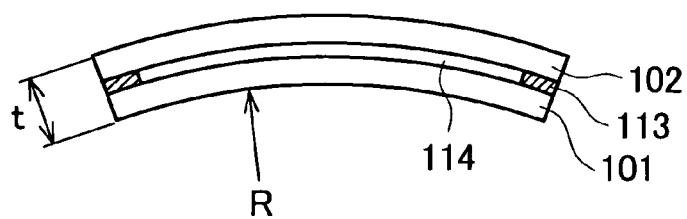
FIG. 7B is a diagram showing parameters in FIG. 7A.

FIG. 7A is a diagram showing a thickness of the liquid crystal display panel 10 and a coverable range to an extent that glass is not broken. FIG. 7B is a diagram showing parameters in FIG. 7A. As shown in FIG. 7B, the liquid crystal display panel 10 has a TFT substrate 101 having formed thereon TFTs and pixel electrodes, a color filter substrate 102 having formed thereon color filters, and a liquid crystal layer 114 interposed between the TFT substrate 101 and the color filter substrate 102. The liquid crystal layer 114 is sealed by a sealant 113.

A glass substrate forming the liquid crystal display panel 10 is standardized at a thickness of 0.7 mm or 0.5 mm. Accordingly, when the glass substrate is thinned in order to give a larger curvature, after the liquid crystal display panel 10 is formed, the outside of the glass substrate is polished thin. Mechanical polishing and chemical polishing are used together. In this case, the TFT substrate 101 and the color filter substrate 102 are polished. The liquid crystal layer 114 has a thickness of several μm, and it is negligible in view of the total thickness t of the liquid crystal display panel 10.

In FIG. 7A, the vertical axis represents the radius of curvature of the liquid crystal display panel 10. The radius of curvature is defined as a radius of curvature inside of the liquid crystal display panel 10, as shown in FIG. 7B. In FIG. 7A, the horizontal axis represents a glass thickness, that is, the total thickness t of the liquid crystal display panel 10. In FIG. 7A, when the horizontal axis represents 0.2 mm, the thickness of the TFT substrate 101 or the color filter substrate 102 is 0.1 mm.

In FIG. 7A, a line G represents a destruct line of glass. That is, if it is below the line G, the glass substrate is broken, and if it is above the line G, the glass substrate is not broken. When the radius of curvature is R, and the thickness of the liquid crystal display panel 10 is t, in regards to the line G, the relationship R=400 t is established. That is, if the radius of curvature R is 400 times or less larger than the thickness, the glass substrate is broken. If glass has a scratch, glass is broken even slightly above the line G. For this reason, in an actual product, it is preferable that a margin two times larger than the line G be given, and an area on a line satisfying the relationship R=800 t or above be used. In a product according to this example, as shown in FIG. 7A, the relationship between the glass substrate and the curvature is set with a margin above the line G.

Figure 8:
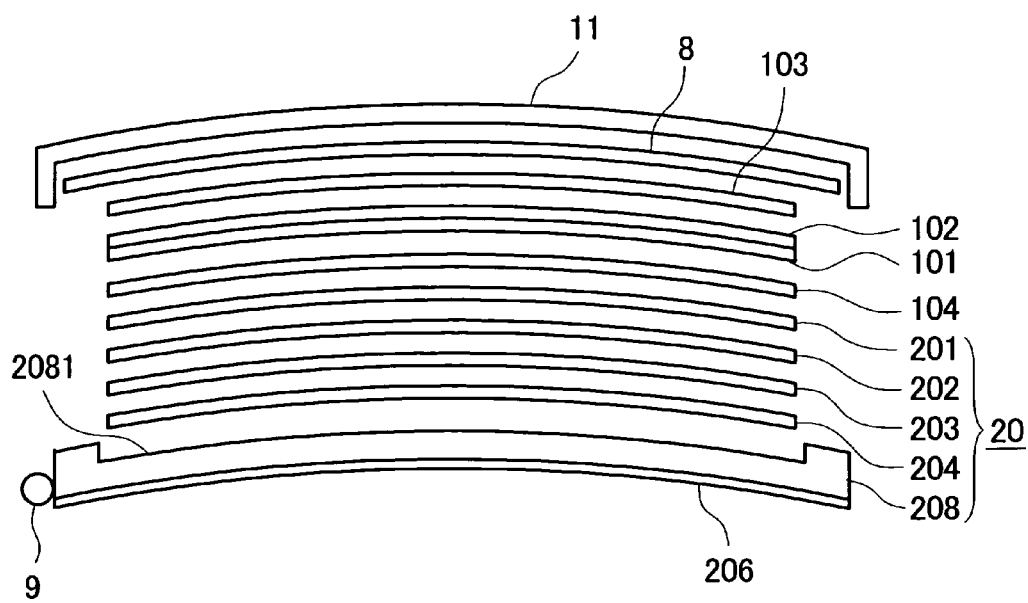
FIG. 8 is an exploded sectional view of the liquid crystal display according to the first example.

FIG. 8 is an exploded sectional view taken along the line A-A of FIG. 6. In FIG. 8, a frame portion of the frame 11 has a predetermined curvature. With the curvature of the frame portion of the frame 11, the display unit of the liquid crystal display panel 10 has a predetermined curvature. A transparent surface cover 8 is provided below the frame 11. The surface cover 8 also has a predetermined curvature, and the surface cover 8 follows the liquid crystal display panel 10, such that the liquid crystal display panel 10 has a predetermined curvature. The surface cover 8 also protects the liquid crystal display panel 10.

The liquid crystal display panel 10 is provided below the surface cover 8. The liquid crystal display panel 10 has the same configuration as that shown in FIG. 1 or the like. The glass substrate is polished until the liquid crystal display panel 10 is thinned so as to have a predetermined curved surface. When the liquid crystal display panel 10 is manufactured, the liquid crystal display panel 10 has a flat surface. Thereafter, the liquid crystal display panel 10 is provided in the frame 11, and the liquid crystal display panel 10 has a curved surface, such that a screen having a predetermined curved surface is set. Of course, the relationship between the total thickness of the TFT substrate 101 and the color filter substrate 102, and the radius of curvature needs to be above the line G shown in FIG. 7A.

The backlight 20 is provided below the liquid crystal display panel 10. The backlight 20 has various optical sheets, a light guide plate 208, and an LED 9. In this example, the LED 9 is used as a light source. The LED 9 is provided on a side of the light guide plate 208. The side arrangement ensures reduction in thickness of the liquid crystal display. The light guide plate 208 guides light incident on the side from the LED 9 toward the liquid crystal display panel 10. In FIG. 8, the light source is provided on the side, but in some display devices, a light source may be provided below optical parts. In this case, instead of the light guide plate, a diffusion plate for diffusing light is used.

A concave portion 2081 is formed at an upper surface of the light guide plate 208, and the optical sheets are placed in the concave portion 2081, such that the optical sheets are fixed. The concave portion 2081 formed at the upper surface of the light guide plate 208 is formed to have the same curved surface as the screen of the liquid crystal display. If the light guide plate 208 is pressed against the liquid crystal display panel 10 through the optical sheets, the screen of the liquid crystal display panel 10 has a predetermined curved surface according to the curved surface of the frame 11. In this example, the light guide plate 208 has a plate shape of a thickness 2 mm, but the light guide plate 208 does not necessarily have a uniform thickness. For example, the upper surface of the light guide plate 208 may be the same curved surface as the screen of the display screen, and a lower surface of the light guide plate 208 may be a flat surface. The light guide plate 208 is made of polycarbonate, and has predetermined rigidity.

Light, which is emitted from the LED 9 and goes toward a side opposite to the liquid crystal display panel 10 is reflected by a reflection sheet 206 and goes toward the liquid crystal display panel 10. Light passing through the light guide plate 208 transmits a lower diffusion sheet 204. The lower diffusion sheet 204 makes light passing through the light guide plate 208 uniform.

A lower prism sheet 203 is provided on the lower diffusion sheet 204. The lower prism sheet 203 has a plurality of prisms that are formed at regular pitches to extend in a horizontal direction of the screen, and collects light, which is going to spread in a vertical direction of the screen from the backlight 20, in a direction perpendicular to the screen of the liquid crystal display panel 10. That is, the prism sheet ensures an increase in front luminance. An upper prism sheet 202 is provided on the lower prism sheet 203. The upper prism sheet 202 has a plurality of prisms that are formed at regular pitches to extend in a direction perpendicular to the lower prism sheet 203, for example, in the vertical direction of the screen. The upper prism sheet 202 collects light, which is going to spread in the horizontal direction of the screen from the backlight 20, in the direction perpendicular to the screen of the liquid crystal display panel 10. The lower prism sheet 203 and the upper prism sheet 202 can collect light, which is going to spread in the vertical and horizontal directions of the screen, in the direction perpendicular to the screen.

An upper diffusion sheet 201 is provided on the upper prism sheet 202. The prism sheet has prisms that are formed at 50 µm pitches to extend in a predetermined direction. That is, bright and dark stripes are formed by the 50 µm pitches. The liquid crystal display panel 10 has scanning lines, which are formed at regular pitches to extend in the horizontal direction of the screen, and data signal lines, which are formed at regular pitches to extend in the vertical direction of the screen. Therefore, bright and dark stripes are formed by the pitches of the scanning lines or the data signal lines. Accordingly, the bright and dark stripes of the prisms interfere with the bright and dark stripes of the liquid crystal display panel 10, and moire occurs. The upper diffusion sheet 201 reduces moire by the diffusion operation.

Like this example, in a liquid crystal display in which a screen has an outwardly convex shape, as shown in FIG. 1, the absorption axis of the upper polarizing plate 103 is adapted to match with the curved direction of the screen. Therefore, even if it is used for a long term, it is possible to maintain good image quality without causing a change in polarization characteristic of the polarizing plate. In addition, if the absorption axis of the lower polarizing plate 104 is adapted to be perpendicular to the curved direction of the screen, it is possible to achieve a further effect.

Second Example

Figure 9:
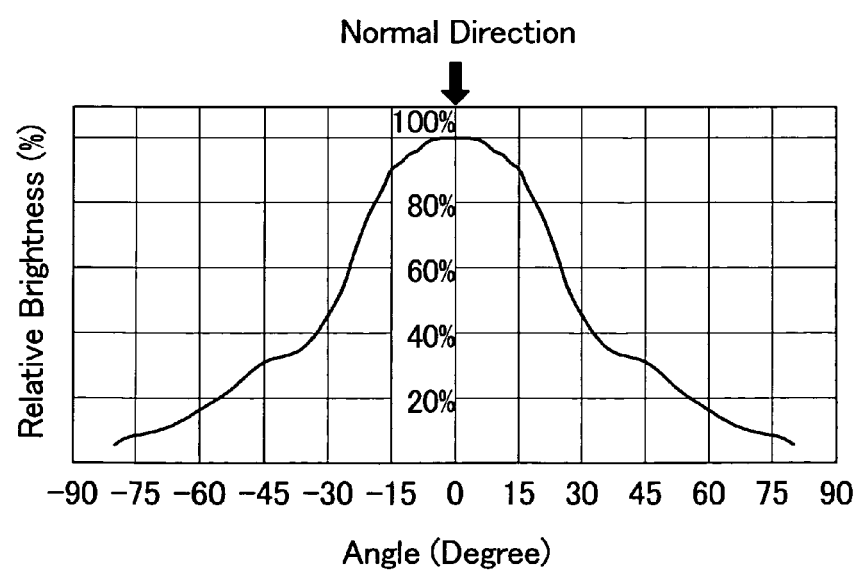
FIG. 9 shows an example of a viewing angle characteristic of a liquid crystal display panel.

In the first example, the screen of the liquid crystal display has an outwardly convex shape. The invention can be applied to a liquid crystal display in which a screen has a concave shape. FIG. 9 shows viewing angle characteristics of the liquid crystal display panel 10. In terms of image quality of the liquid crystal display panel 10, there is a problem in that luminance, chromaticity, or the like is changed depending on an angle at which a person views the screen. FIG. 9 shows the viewing angle characteristics in a typical TN-type liquid crystal display. In FIG. 9, the vertical axis represents luminance. It is assumed that luminance when the screen is viewed from a direction perpendicular to the screen is 100%. In FIG. 9, the horizontal axis represents an angle at which the screen is viewed. That is, if it is assume that the angle when the screen is viewed from the direction perpendicular to the screen is 0 degree, the horizontal axis represents an angle off from the direction perpendicular to the screen. As shown in FIG. 9, when the liquid crystal screen is viewed at 30 degrees to be off from the direction perpendicular to the liquid crystal screen, luminance is decreased to about 40%. The decrease in luminance varies by color, and as a result the colors are changed depending on the viewing angle.

The viewing angle characteristics vary depending on the driving method of the liquid crystal display. For example, IPS (In Plane Switching)-type liquid crystal in which the liquid crystal molecules are rotated in a direction parallel to the TFT substrate 101 to thereby control light transmission is excellent in viewing angle characteristics, as compared with the typical TN-type liquid crystal. In any cases, when the screen has a flat surface or an outwardly convex shape, it is necessary to improve the viewing angle characteristics of the liquid crystal display panel 10.

Figure 10:
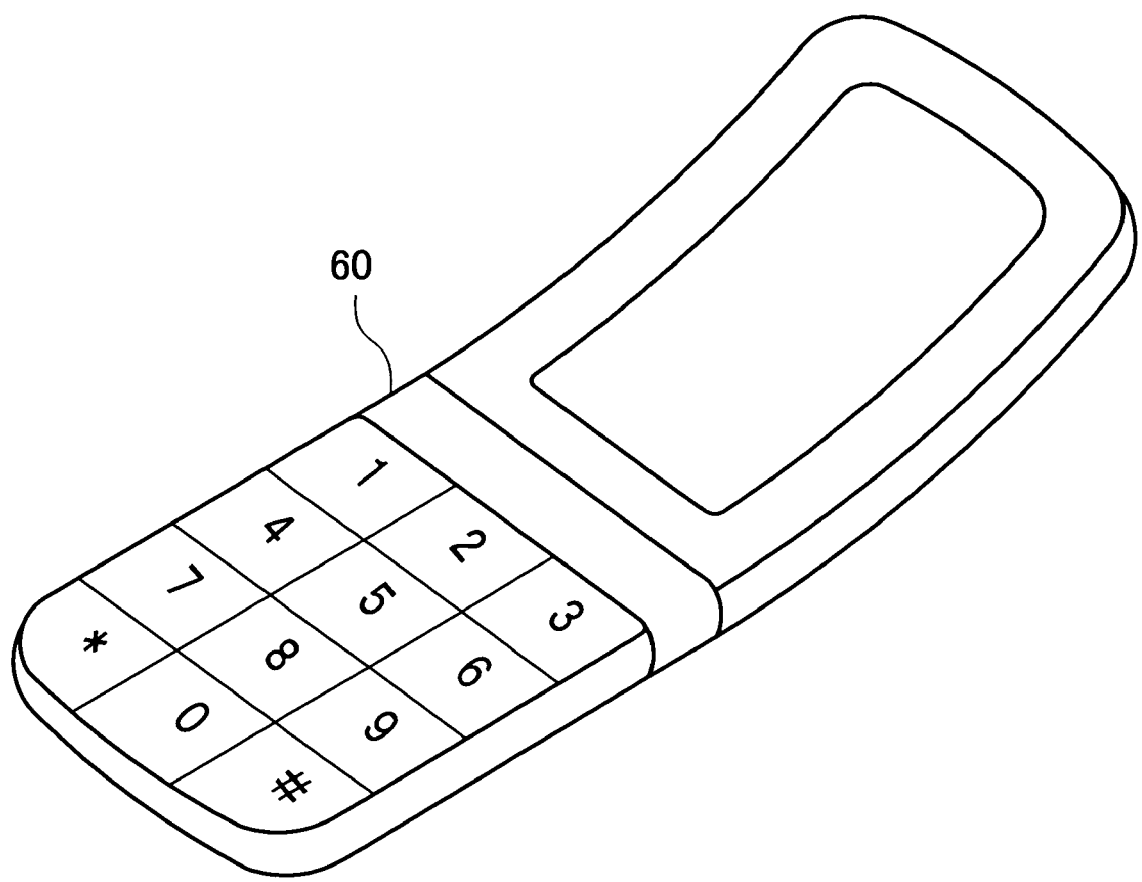
FIG. 10 is an exterior perspective view of a mobile phone.

FIG. 10 shows an example where a liquid crystal display according to an embodiment of the invention, in which a screen has an outwardly concave shape, is applied to a mobile phone 60. In a small display device for the mobile phone 60, if the screen is designed to have a specific curvature, visibility is improved. In addition, the screen is small, and thus even if the screen has a curvature, there is an insignificant effect on the thickness of the display device.

Figure 11:
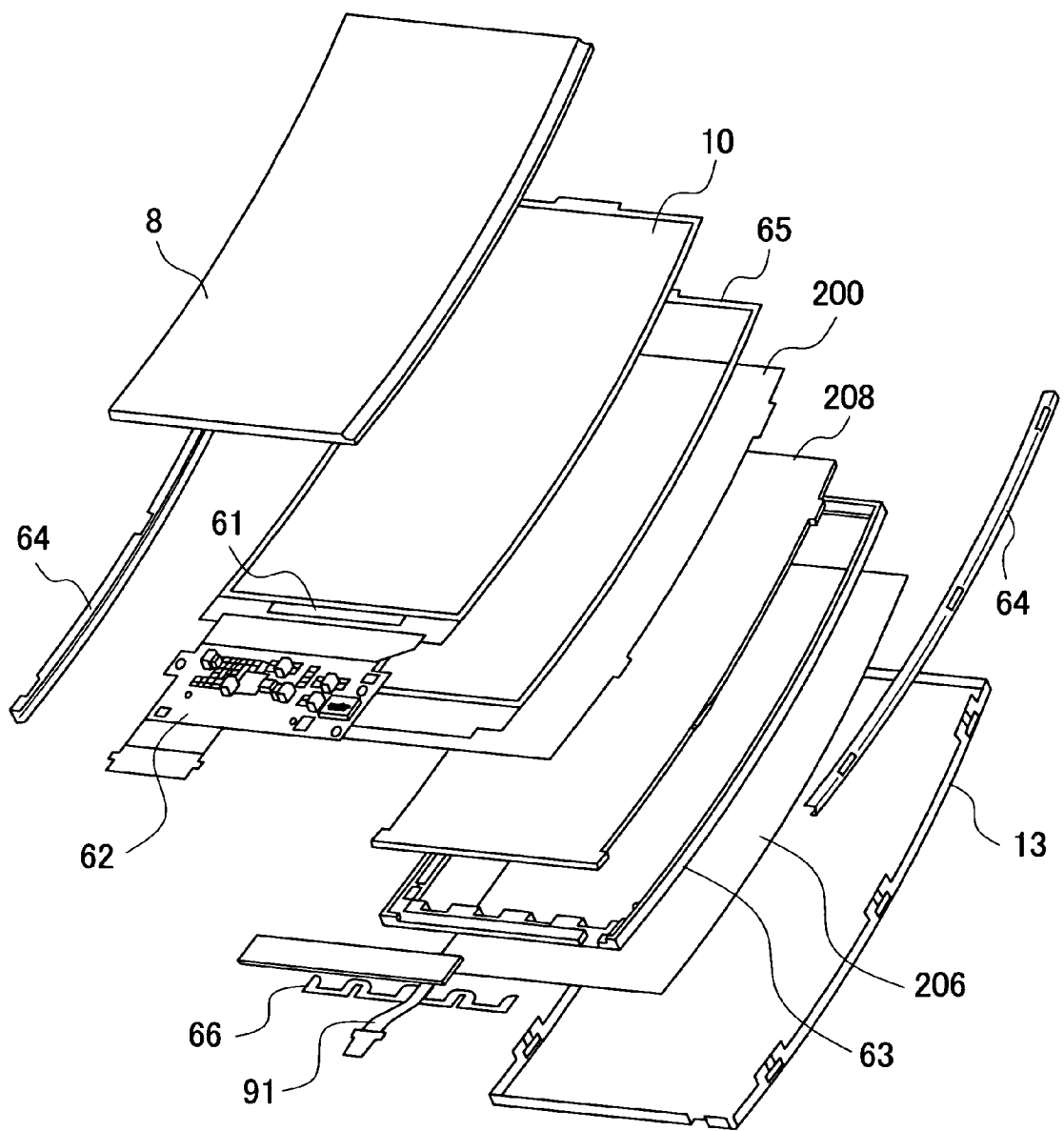
FIG. 11 is an exploded perspective view of a liquid crystal display for a mobile phone.

FIG. 11 is an exploded perspective view of a liquid crystal display used in FIG. 10. In FIG. 11, a transparent surface cover 8 is set in a side frame 64. If the surface cover 8 is set in a groove of the side frame 64, the surface cover 8 has a specific curved surface. The surface cover 8 may have a curvature in advance. The surface cover 8 is made of transparent plastic, such that a curved surface is easily formed.

Figure 12:
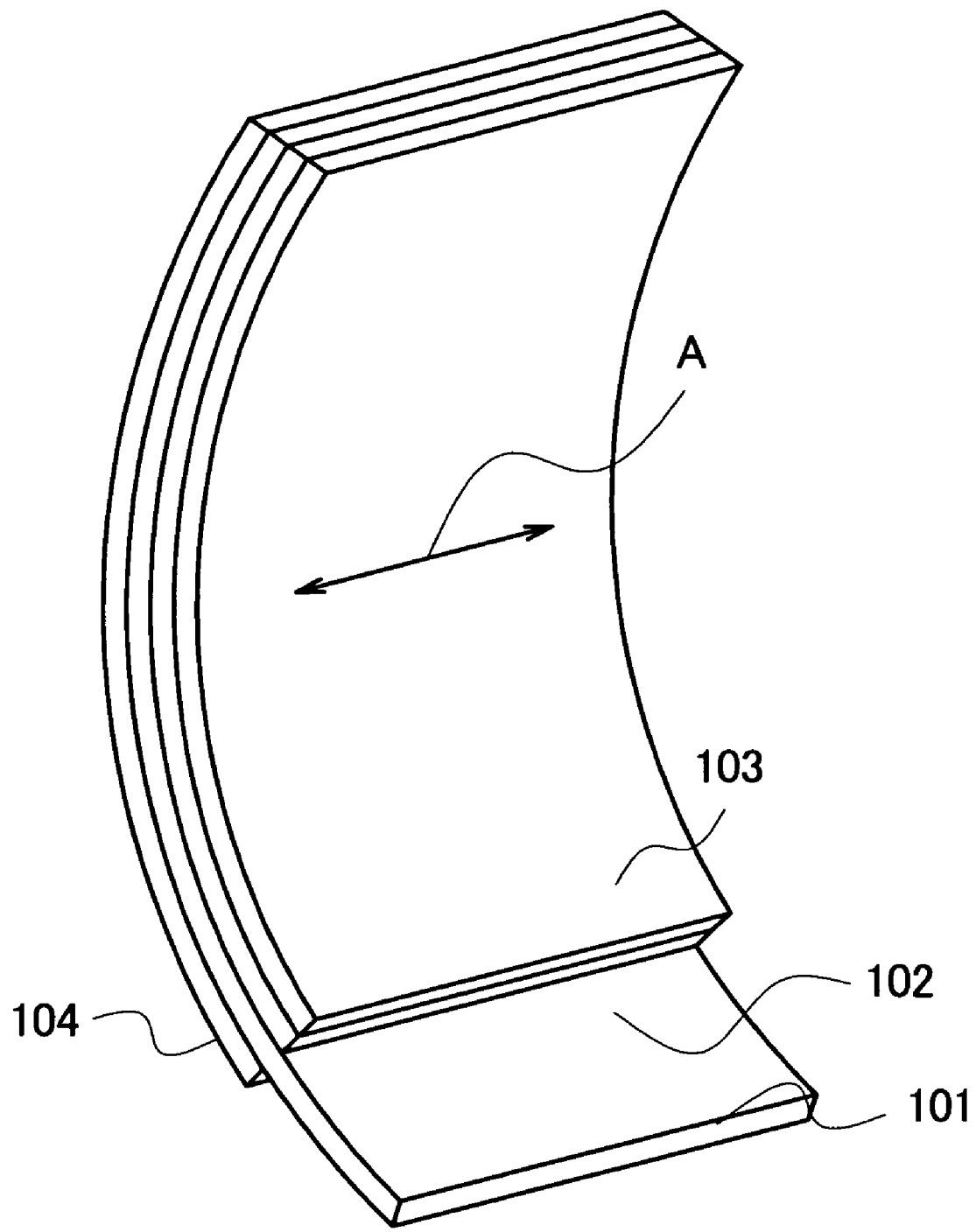
FIG. 12 is a front-side perspective view of a liquid crystal display panel having a concave screen.
Figure 13:
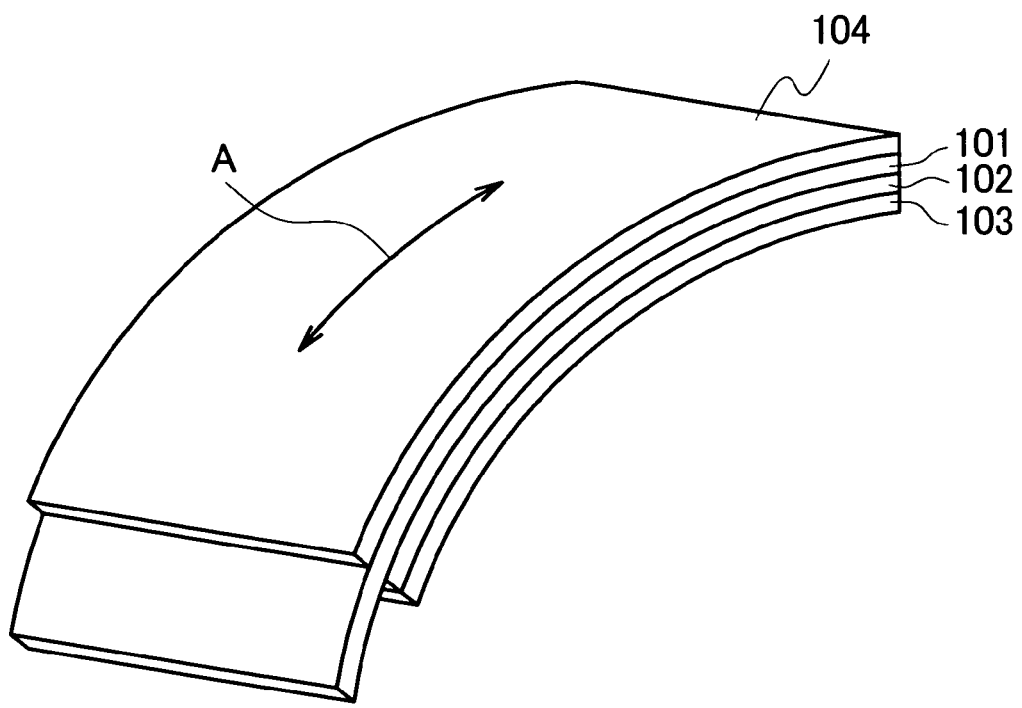
FIG. 13 is a rear-side perspective view of a liquid crystal display panel having a concave screen.

A liquid crystal display panel 10 is provided below the surface cover 8. FIGS. 12 and 13 are exterior views of the liquid crystal display panel 10 used in FIG. 11. FIG. 12 is a diagram of the liquid crystal display panel 10 as viewed from the front side. FIG. 13 is a diagram of the liquid crystal display panel 10 as viewed from the rear side. The liquid crystal display panel 10 shown in FIGS. 12 and 13 has the same configuration as the liquid crystal display panel 10 shown in FIGS. 1 and 3, except that a curvature is opposite.

In this example, an upper polarizing plate 103 receives compression stress, and accordingly, the absorption axis A of the upper polarizing plate 103 is perpendicular to the curved direction of the liquid crystal display panel 10. Meanwhile, a lower polarizing plate 104 receives tensile stress, and accordingly the absorption axis A of the polarizing plate is the same as the curved direction of the liquid crystal display panel 10. As described with reference to FIGS. 4 and 5, it is possible to achieve an effect insofar as an angle between the curved direction of the liquid crystal display panel 10 and the absorption axis of the polarizing plate has a tolerance within ±5 degrees. In addition, as described with reference to FIGS. 4 and 5, according to the purpose of the display device, it is possible to achieve an effect even if the angle between the curved direction of the liquid crystal display panel 10 and the absorption axis of the polarizing plate is set to about 10±5 degrees.

In order to curve a liquid crystal cell formed by the TFT substrate 101, the color filter substrate 102, and the liquid crystal layer 114, similarly to the first example, the TFT substrate 101 and the color filter substrate 102 are polished thin. Although the liquid crystal display panel 10 is formed by adhering the upper polarizing plate 103 and the lower polarizing plate 104 to the liquid crystal cell, the resultant liquid crystal display panel 10 is thin and small rigidity. As a result, a curved surface is easily formed to follow the surface cover 8.

Returning to FIG. 11, the TFT substrate 101 of the liquid crystal display panel 10 is formed to be larger than the color filter substrate 102. A driver chip 61 is provided on the TFT substrate 101, and a flexible wiring board 62 for supplying power and signals from the outside is connected to the liquid crystal display panel 10.

A light-blocking tape 65 is provided along a peripheral portion on the lower side of the liquid crystal display panel 10. The light-blocking tape 65 prevents contrast from being deteriorated due to light leakage to the peripheral portion of the liquid crystal display panel 10 from the backlight 20. Optical sheets 200 are provided below the light-blocking tape 65. In FIG. 11, the optical sheets 200 are shown as a single sheet, but actually, as shown in FIG. 8, an upper diffusion sheet 201, an upper prism sheet 202, a lower prism sheet 203, and a lower diffusion sheet 204 are provided. The functions of the individual sheets are as described in the first example. In FIG. 11, however, the curved direction of the optical sheet is opposite to that shown in FIG. 8.

A light guide plate 208 is provided below the optical sheets 200. An upper surface of the light guide plate 208 has the same curved surface as the screen of the liquid crystal display panel 10. The optical sheets are provided along the curved upper surface of the light guide plate 208, and thus the optical sheets also have the same curved surface as the screen of the liquid crystal display panel 10. A flexible wiring board 91 for an LED, on which an LED 9 is mounted, is provided on a side of the light guide plate 208. In FIG. 11, light emitted from the LED 9 is supplied through a short side of the light guide plate 208. A light-blocking tape 66 for a light source is provided below the flexible wiring board 91 for an LED to prevent light from leaking from the LED 9.

These optical members are accommodated in a mold 63 made of resin. A reflection sheet 206 is provided below the mold 63. The reflection sheet 206 reflects light, which is emitted from the LED 9 and goes toward a side opposite to the liquid crystal display panel 10, to go toward the liquid crystal display panel 10. The liquid crystal display panel 10, the backlight 20, and the like are held by a rear cover 13 made of a metal.

In this example, it is possible to easily form the curved surface of the screen of the liquid crystal display panel 10 insofar as it has a cylindrical shape. In this case, a direction in which the liquid crystal display panel 10 has a curvature is a long axis direction of the screen. In this example, the size of the screen is 2.75 inches in diagonal, and the radius of curvature of the curved surface in the long axis direction is approximately 185 mm. Although the curvature is small, it has a significant effect on visibility. Meanwhile, even if a curvature is given, there is an insignificant effect on the thickness of the liquid crystal display due to the small screen.

In this example, the TFT substrate 101 and the color filter substrate 102 have a thickness of 0.15 mm, and the liquid crystal cell has a thickness of 0.3 mm. As shown in the graph of FIG. 7A, if the liquid crystal cell has a thickness of 0.3 mm, it is possible to form the radius of curvature 185 mm with a margin. Even if the screen has a curvature, it is possible to suppress the thickness of the liquid crystal display of this example, that is, the total thickness of the liquid crystal display panel 10 and the backlight 20, to approximately 12 mm.

Figure 14:
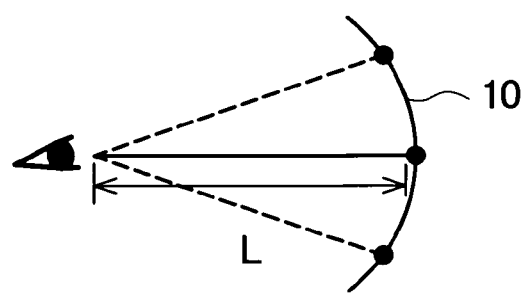
FIG. 14 is a schematic view showing a case where a concave screen is viewed.

FIG. 14 is a schematic view for evaluation of an adequate radius of curvature of a screen in a portable apparatus, such as the mobile phone 60. A person views a display screen with the mobile phone 60 held by his/her hand. A distance between the eyes and the screen is in a range of approximately 20 cm to 30 cm. Therefore, if a display device has a concave screen with a radius of curvature ranging from approximately 15 cm to 40 cm, it is possible to significantly visibility. A direction in which the display device has a curvature may be a long axis direction or a short axis direction, but for further improvement in visibility, the display device has a curvature in the long axis direction.

As described above, according to the embodiment of the invention, in a liquid crystal display panel in which a screen has an outwardly curved surface with a curvature in one direction, the absorption axis of the upper polarizing plate, which is attached to the color filter substrate, is adapted to match with the curved direction of the liquid crystal display panel. Therefore, it is possible to suppress a change in polarization characteristics of the upper polarizing plate. In addition, the absorption axis of the lower polarizing plate, which is attached to the TFT substrate, is adapted to match with the curved direction of the liquid crystal display panel, it is possible to suppress a change in polarization characteristics of the lower polarizing plate. As a result, according to the embodiment of the invention, it is possible to obtain a liquid crystal display having an outwardly concave screen, which is capable of displaying images with excellent contrast for a long term.

Third Example

Figure 15:
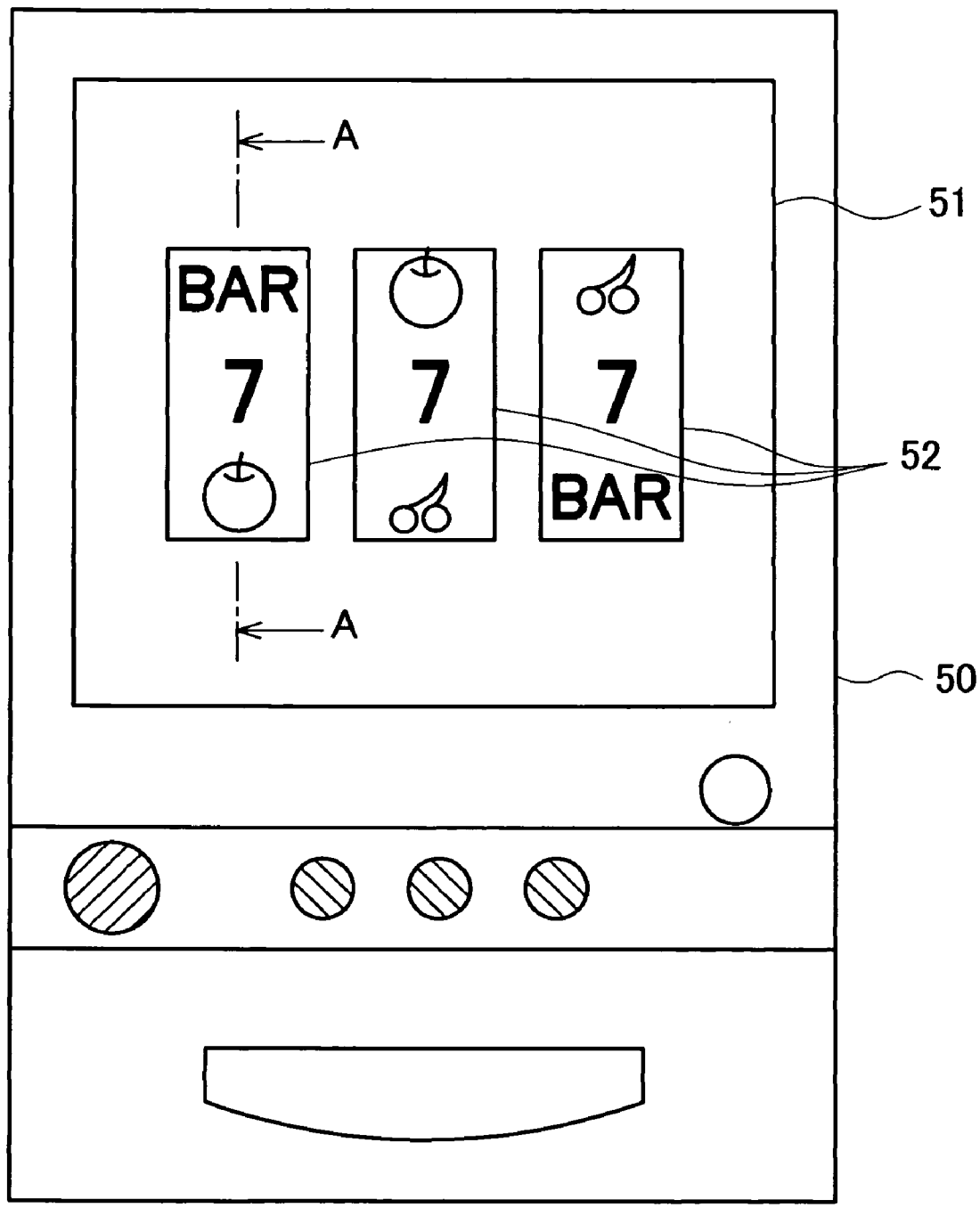
FIG. 15 is a front view of a slot machine.

FIG. 15 shows an example where a liquid crystal display of this example is used for a slot machine 50. A display screen 51 of the slot machine 50 is formed by a large liquid crystal screen 51. Rectangular holes are formed at three places near the center of the liquid crystal screen 51. A drum 52 having written various kinds of information on its surface is set in each rectangular hole. A player plays a game by using the rotating drum 52 together with information on the liquid crystal screen 51 while controlling buttons.

Figure 16:
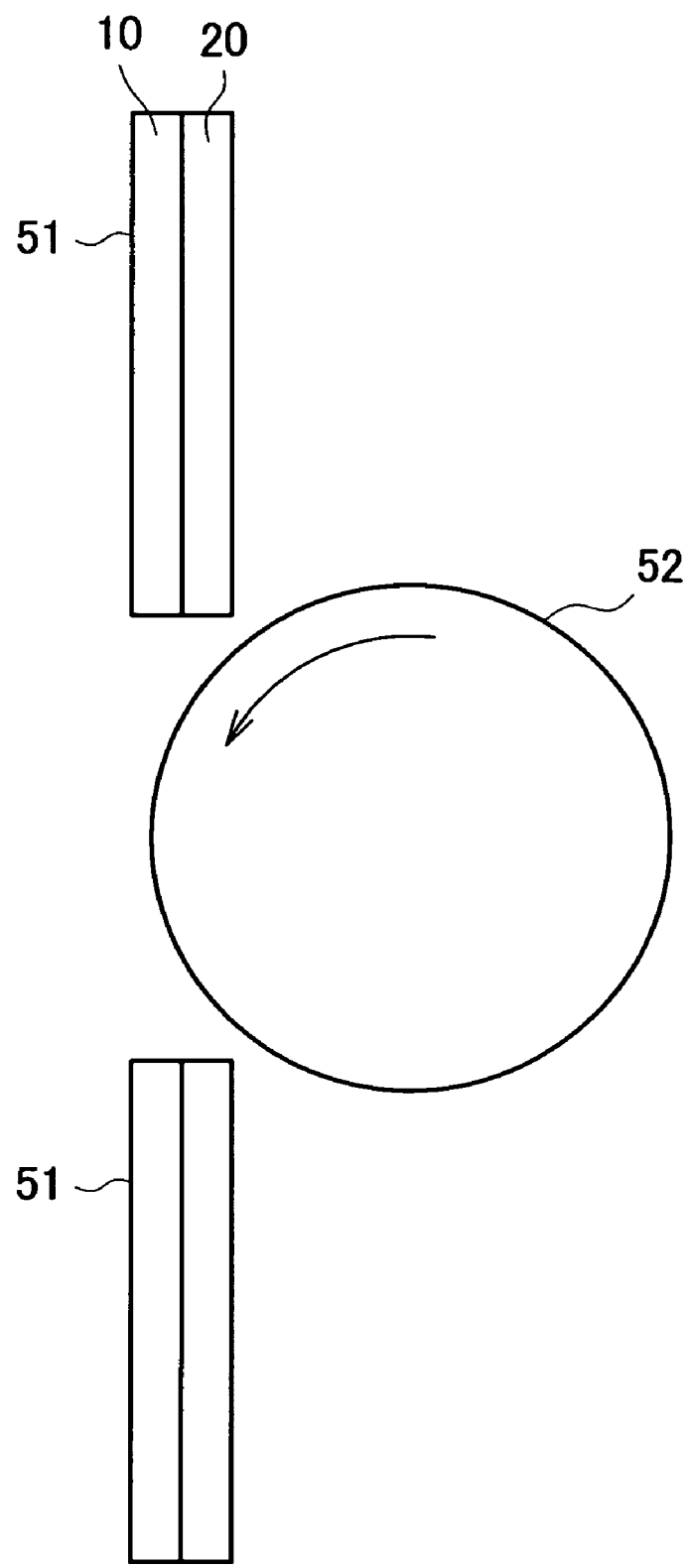
FIG. 16 is a partial sectional view of a slot machine.

FIG. 16 is a partial sectional view of a drum 52 and a liquid crystal display in a known slot machine 50 taken along the line A-A of FIG. 15. In FIG. 16, a display unit 51 is formed by a liquid crystal display, and has a liquid crystal display panel 10 and a backlight 20. A rectangular hole is formed at the center of the liquid crystal display, and the drum 52 having written various kinds of information on its surface is provided in the rectangular hole. While a player plays a game, the drum 52 is rotated in an arrow direction.

In the known slot machine shown in FIG. 16, the rotating drum 52 and the liquid crystal display need to be interlocked with each other, and the mechanical configuration becomes complicated. In addition, to prevent the player from feeling boring, the slot machine 50 needs to be frequently replaced with a new model. For the introduction of a new model, the drum 52 needs to be replaced and the slot machine 50 needs to be changed. For this reason, a manager of a playground where slot machines are installed has to bear an economic burden according to the introduction of a new model.

Figure 17:
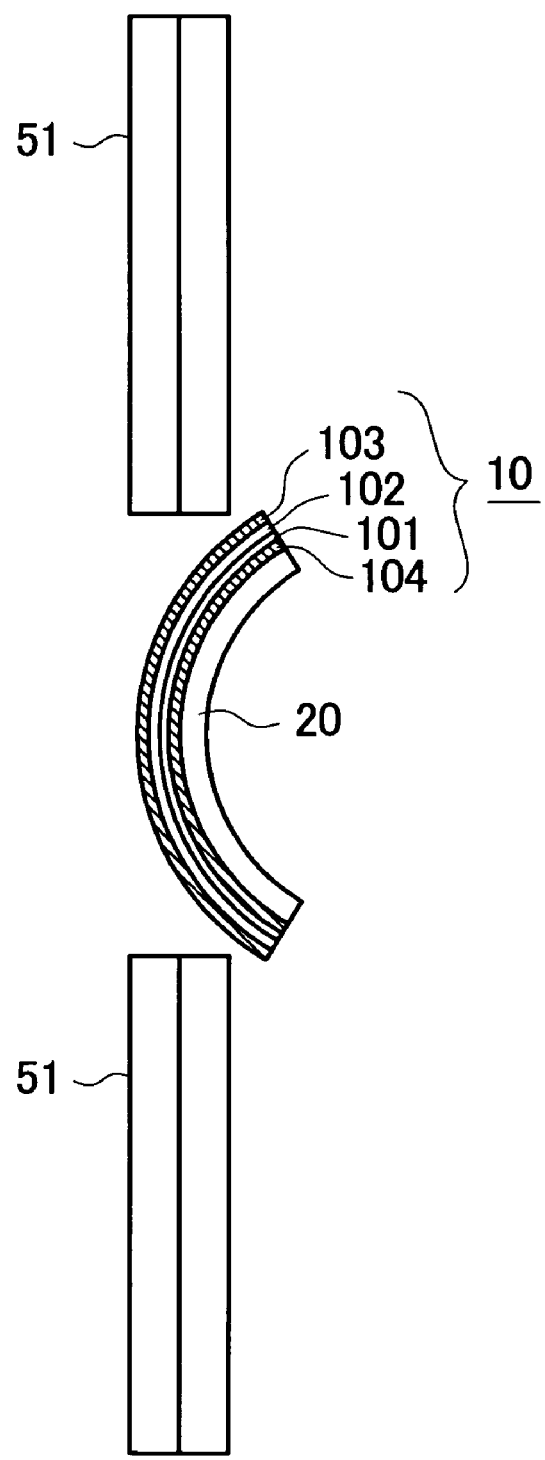
FIG. 17 shows an example where the invention is applied to a slot machine.

FIG. 17 shows an example where a liquid crystal display of this example is applied to a slot machine 50. The example shown in FIG. 17 is different from the related art shown in FIG. 16 is in that no drum 52 is provided, and a liquid crystal display having a curved screen according to an embodiment of the invention is used. In FIG. 17, an image is displayed on a liquid crystal screen as if a drum is rotating. Accordingly, a player has an illusion as if a drum is rotating, and as shown in FIG. 16, he/she can play a game while having the same feeling as when the drum is actually rotating.

This is advantages in that, when a new mode is introduced, the drum 52 does not need to be substituted, and it is sufficient to change only software. From this viewpoint, it is possible to significantly reduce an economic burden on the manager of the playground. As shown in FIG. 17, the liquid crystal display panel 10, which is used for the slot machine 50, has a small radius of curvature. Therefore, the radius of curvature of each of the upper polarizing plate 103 and the lower polarizing plate 104 when the liquid crystal display panel 10 is curved becomes small, and tensile stress and compression stress increases so much.

In FIG. 17, large tensile stress is applied to the upper polarizing plate 103, and large compression stress is applied to the lower polarizing plate 104. If the liquid crystal display panel 10 shown in FIG. 17 has the same configuration as that shown in FIG. 1 or 3, it is possible to prevent optical characteristics of the polarizing plate from being deteriorated when it is used for a long term. The invention is particularly effective if it is applied to a display device having a curved surface with a small radius of curvature, as shown in FIG. 17.

Fourth Example

Figure 18:
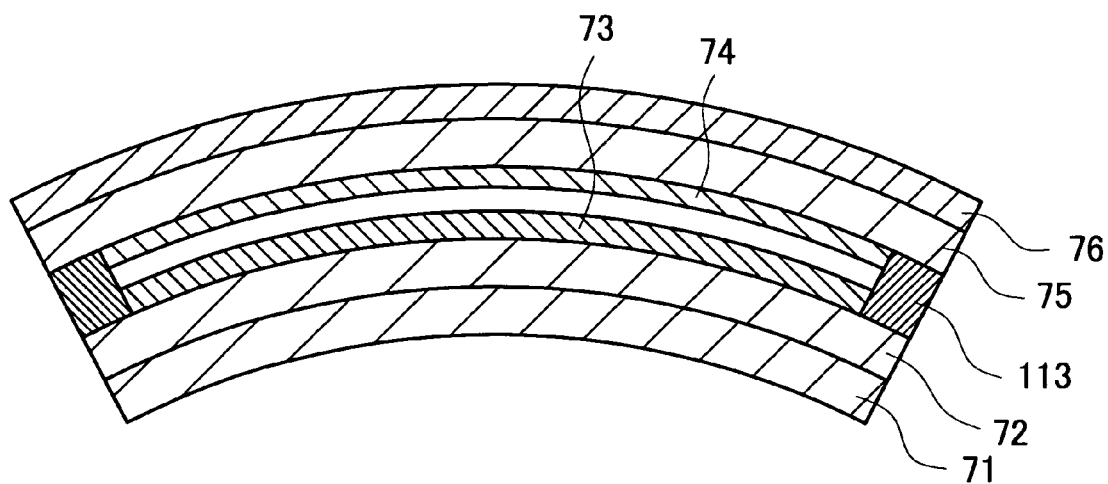
FIG. 18 shows an example where the invention is applied to a top emission-type organic EL display.

As a thin display device, in addition to the liquid crystal display, an organic EL display is exemplified. The organic EL display can be curved. In addition, the invention can be applied to a curved organic EL display. FIG. 18 is a schematic sectional view showing an example where the invention is applied to an organic EL display. In FIG. 18, it is assumed that a screen has an outwardly convex shape, but no curvature is given in a direction perpendicular to that in which a curvature is given.

In FIG. 18, on an OLED (Organic Light Emitting Device) substrate made of glass, an organic EL layer 73, which emits light, and TFTs, signal lines, power lines, and the like for controlling the organic EL layer 73 are formed. The organic EL layer 73 undergoes deterioration in characteristics due to moisture. To prevent the characteristics of the organic EL layer 73 from being deteriorated due to moisture, a seal substrate 75 is provided to be opposed to the OLED substrate 72, and the internal organic EL layer 73 is encapsulated by the sealant 113. A desiccant 74 is provided in the seal substrate 75 to eliminate moisture inside the seal. The OLED substrate 72 and the seal substrate 75 are combined with each other to form an organic EL display panel.

The seal substrate 75 may be made of resin, but since resin is liable to transmit moisture, a thin metal film may be formed inside the seal substrate 75. The seal substrate 75 may be made of glass. In this case, the OLED substrate 72 and the seal substrate 75 are both made of glass. In order to enable the organic EL display panel to be curved, the OLED substrate 72 and the seal substrate 75 are polished thin. At this time, since the organic EL display panel has insufficient strength, a reinforcing plate 71 made of transparent resin is attached to the organic EL display panel. The reinforcing plate 71 may be attached or not depending on the mechanical strength of the OLED substrate 72.

A circular polarizing plate 76 is adhered onto the seal substrate 75. The circular polarizing plate 76 is provided to suppress reflected light from the outside. The circular polarizing plate 76 has a quadrature a λ/4 retardation film and a polarizing plate. That is, when light passes through the circular polarizing plate 76 two times, the polarization direction is rotated at 90 degrees. If light, which passes through the circular polarizing plate 76 and is reflected by the OLED substrate 72, is going to go to the outside, light is circularly polarized again. Therefore, light is absorbed by the absorption axis of the polarizing plate, and it may not go to the outside. As a result, it is possible to suppress an influence of external light, and to obtain an image with high contrast.

The circular polarizing plate 76 has a retardation film and a polarizing plate. When the organic EL display panel is curved, similarly to the liquid crystal display panel 10, the absorption axis of the polarizing plate is adapted to match with a direction in which tensile stress is applied to the polarizing plate. In addition, similarly to the polarizing plate, the retardation film is uniaxially extended. Therefore, according to this example, if the extension direction of the retardation film is adapted to match with the curved direction of the organic EL display panel, it is possible to suppress a change in characteristics of the retardation film.

The organic EL display is divided into a top emission type in which a light emitted from the organic EL layer 73 goes toward a side opposite to the OLED substrate 72, and an image is formed on the seal substrate 75, and a bottom emission type in which light emitted from the organic EL layer 73 goes toward the OLED substrate 72, and an image is formed on the OLED substrate 72. FIG. 18 shows an example of a top emission-type organic EL display.

FIG. 18 shows a case where the organic EL display is of a top emission type, and a screen has an outwardly convex shape. In this case, since tensile stress is applied to the circular polarizing plate 76, the extension axis direction of the retardation film or the polarizing plate forming the circular polarizing plate 76 is adapted to match with a direction in which the organic EL display panel has a curvature. When the organic EL display is of a top emission type, and a screen has an outwardly concave shape, since compression stress is applied to the circular polarizing plate 76, it is necessary to match the extension axis direction of the retardation film or the polarizing plate forming the circular polarizing plate 76 with a direction in which the organic EL display panel has a curvature.

Figure 19:
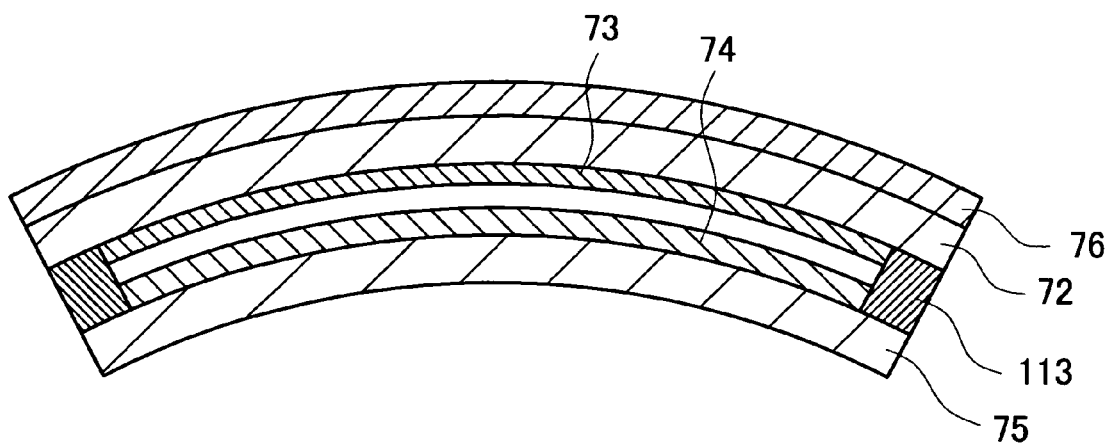
FIG. 19 shows an example where the invention is applied to a bottom emission-type organic EL display.

FIG. 19 is a sectional view of an organic EL display panel, which is an example of a bottom emission-type organic EL display. In FIG. 19, a screen has an outwardly convex shape. It is assumed that no curvature is given in a direction perpendicular to a direction in which the screen has a curvature, as shown in FIG. 19. In FIG. 19, light is emitted from the organic EL layer 73 toward the OLED substrate 72 and an image is formed on the OLED substrate 72. For this reason, a circular polarizing plate 76 is attached to the OLED substrate 72.

The organic EL layer 73 formed on the OLED substrate 72 is encapsulated by the seal substrate 75 through a sealant 113. This is to prevent moisture from entering from the outside. A desiccant 74 is provided in the seal substrate 75. In FIG. 19, no reinforcing plate 71 is provided. In FIG. 19, the circular polarizing plate 76 is attached to the TFT substrate 101. In this case, since tensile stress is applied to the circular polarizing plate 76, the extension axis of the retardation film or the polarizing plate forming the circular polarizing plate 76 is adapted to match with the curved direction of the organic EL display panel.

In case of a bottom emission type, when a screen has an outwardly concave shape, the basis configuration is the same as that shown in FIG. 19, except that the curvature direction is opposite. In this case, however, unlike that shown in FIG. 19, compression stress is applied to the circular polarizing plate 76. Therefore, the extension axis of the retardation film or the polarizing plate forming the circular polarizing plate 76 is adapted to match with a direction perpendicular to the curved direction of the organic EL display panel.

In the foregoing description, a case where the retardation film and the polarizing plate forming the circular polarizing plate 76 are both uniaxially extended has been described. However, the retardation film may be formed without being uniaxially extended. In this case, the extension axis direction of the polarizing plate is adapted as described in the foregoing example.

The extension axis direction of the retardation film or the polarizing plate and the direction in which the organic EL display panel has a curvature are misaligned due to manufacturing errors, but in the case of the organic EL display, it is possible to achieve an effect if the tolerance is within ±5 degrees.

As described above, if the invention is applied to the curved organic EL display, it is possible to suppress a change in characteristics of the circular polarizing plate 76 having the polarizing plate and the retardation film. As a result, it is possible to obtain an organic EL display that is excellent in contrast for a long term.

What is claimed is:

1. A liquid crystal display comprising:
 a liquid crystal display panel, the liquid crystal display panel including a TFT substrate having formed thereon pixel electrodes and TFTs, a color filter substrate having formed thereon color filters, liquid crystal interposed between the color filter substrate and the TFT substrate, a first polarizing plate attached to the color filter substrate, and a second polarizing plate attached to the TFT substrate,
 wherein the liquid crystal display panel has an outwardly convex screen with a curvature in one direction, and the first polarizing plate substantially has an absorption axis in a direction in which the liquid crystal display panel has a curvature, and
 an angle between an axis in the direction, in which the liquid crystal display panel has a curvature, and the absorption axis of the first polarizing plate is 10±5 degrees.

2. The liquid crystal display according to claim 1,
 wherein the absorption axis of the second polarizing plate and a direction perpendicular to that in which the liquid crystal display panel has a curvature is 10±5 degrees.

3. A liquid crystal display comprising:
 a liquid crystal display panel, the liquid crystal display panel including a TFT substrate having formed thereon pixel electrodes and TFTs, a color filter substrate having formed thereon color filters, liquid crystal interposed between the color filter substrate and the TFT substrate, a first polarizing plate attached to the color filter substrate, and a second polarizing plate attached to the TFT substrate,
 wherein the liquid crystal display panel has an outwardly concave screen with a curvature in one direction, and an angle between the absorption axis of the first polarizing plate and a direction perpendicular to that in which the liquid crystal display panel has a curvature is 10±5 degrees.

4. The liquid crystal display according to claim 3,
 wherein an angle between the absorption axis of the second polarizing plate and the direction in which the liquid crystal display panel has a curvature is 10±5 degrees.

\* \* \* \* \*